(12) United States Patent
Kroon et al.

(10) Patent No.: US 6,920,422 B2
(45) Date of Patent: Jul. 19, 2005

(54) TECHNIQUE FOR MULTI-RATE CODING OF A SIGNAL CONTAINING INFORMATION

(75) Inventors: Peter Kroon, Green Brook, NJ (US); Deepen Sinha, Chatham, NJ (US)

(73) Assignee: Lucent Technologies Inc., Murray Hill, NJ (US)

(*) Notice: Subject to any disclaimer, the term of this patent is extended or adjusted under 35 U.S.C. 154(b) by 596 days.

(21) Appl. No.: 10/039,458

(22) Filed: Nov. 7, 2001

(65) Prior Publication Data

US 2002/0091531 A1 Jul. 11, 2002

Related U.S. Application Data

(62) Division of application No. 09/280,785, filed on Mar. 29, 1999, now Pat. No. 6,366,888.

(51) Int. Cl.[7] .................................. G10L 19/08
(52) U.S. Cl. .................. 704/222; 704/229; 704/500
(58) Field of Search .................. 704/222, 229, 704/500; 341/50, 51; 455/108

(56) References Cited

U.S. PATENT DOCUMENTS

| | | | | |
|---|---|---|---|---|
| 6,104,321 A | * | 8/2000 | Akagiri | 341/50 |
| 6,246,345 B1 | * | 6/2001 | Davidson et al. | 341/51 |
| 6,366,888 B1 | * | 4/2002 | Kroon et al. | 704/500 |
| 6,430,401 B1 | * | 8/2002 | Lou et al. | 455/108 |

OTHER PUBLICATIONS

V. Vaishampayan, "Design of Multiple Description Scalar Quantizers," *IEEE Transactions of Information Theory*, vol. 39, No. 3, May 1993, pp. 821–834.

J. Conway et al., "Voronoi Regions of Lattices, Second Moments of Polytopes, and Quantization," *IEEE Transactions on Information Theory*, vol. IT–28, No. 2, Mar. 1982, pp. 211–226.

M. Eyuboglu et al., "Lattice and Trellis Quantization with Lattice– and Trellis–Bounded Codebooks—High Rate–Theory for Memoryless Sources," *IEEE Transactions on Information Theory*, vol. 39, No. 1, Jan. 1993, pp. 46–59.

L.M. Christianson et al., "A Hierarchical Audio Encoder for Network Traffic Adaptation," Proceedings of the SPIE–The International Society for Optical Engineering, pp. 124–131, 1999.

Z. Lu et al., "An Efficient, Low–Complexity Audio Coder Delivering Multiple Levels of Quality for Interactive Applications," IEEE Second Workshop on Multimedia Signal Processing, pp. 529–534, Dec. 1998.

M. Faloutsos et al., "Multicast Routing with Heterogeneous Quality," Fourth IEEE Workshop on High–Performance Communication Systems, pp. 125–132, Jun. 1997.

* cited by examiner

*Primary Examiner*—Susan McFadden

(57) ABSTRACT

An apparatus for providing at least first and second representations of an audio signal for use in a communications system is described. The apparatus comprises a first quantizer for quantizing at least a portion of the signal in accordance with a first multidimensional lattice to generate a first representation. The apparatus further comprises a second quantizer for quantizing at least a portion of the signal in accordance with a second, different multidimensional lattice to generate a second representation. In an illustrative embodiment, the first representation is a core representation containing core audio information. The second representation is an enhancement representation containing enhancement audio information. The core representation is necessary for recovering the audio signal with minimal acceptable quality. Audio quality is enhanced when the core representation, together with the enhancement representation, is used to recover the audio signal. A method for use in such an apparatus is also described.

10 Claims, 4 Drawing Sheets

100

360

370

390

TECHNIQUE FOR MULTI-RATE CODING OF A SIGNAL CONTAINING INFORMATION

This application is a Divisional of U.S. Ser. No. 09/280,785 filed Mar. 29, 1999, now U.S. Pat. No. 6,366,888.

FIELD OF THE INVENTION

The invention relates to systems and methods for communications of a signal containing information, and more particularly to communications systems and methods for coding the signal to generate multiple representations thereof.

BACKGROUND OF THE INVENTION

Communications of audio information play an important role in multimedia applications, and Internet applications such as a music-on-demand service, music preview for online compact disk (CD) purchases, etc. To efficiently utilize bandwidth to communicate audio information, a perceptual audio coding (PAC) technique has been developed. For details on the PAC technique, one may refer to U.S. Pat. No. 5,285,498 issued Feb. 8, 1994 to Johnston; and U.S. Pat. No. 5,040,217 issued Aug. 13, 1991 to Brandenburg et al., both of which are hereby incorporated by reference. In accordance with such a PAC technique, each of a succession of time domain blocks of an audio signal representing audio information is coded in the frequency domain. Specifically, the frequency domain representation of each block is divided into coder bands, each of which is individually coded, based on psycho-acoustic criteria, in such a way that the audio information is significantly compressed, thereby requiring a smaller number of bits to represent the audio information than would be the case if the audio information were represented in a more simplistic digital format, such as the PCM format.

For example, in providing the aforementioned music-on-demand service, a server connected to the Internet may store PAC compressed versions of each available musical piece to serve client needs. Each version of the musical piece corresponds to a different connection speed at which a client, e.g., a personal computer (PC) having a modem, can afford to communicate over the Internet. The quality, or the lack of distortion, of the version of the musical piece increases with the connection speed corresponding thereto. Thus, for instance, if the server supports (a) a plain old telephone service (POTS) connection speed of about 28.8 kb/sec, (b) an integrated services digital network (ISDN) connection speed of about 64 kb/sec, and (c) a dual ISDN connection speed on the order of 100 kb/sec, three corresponding versions of the musical piece having the respective qualities need to be stored in the server. However, the storage of musical pieces in this manner is undesirably inefficient and occupies much memory space especially when a large number of musical pieces need to be made available.

In delivering the service to a client at a given connection speed, the server may packetize the corresponding audio information in the storage, and communicate the resulting packets through a packet switched network, e.g., the Internet. However, in the event that some of the packets are lost in transit because of imperfect network or channel conditions, which is likely, the quality of the received signal representative of a musical piece would be significantly degraded.

Accordingly, there exists needs for efficiently storing and distributing information at different rates, and effectively maintaining the minimum acceptable quality of the received signal despite imperfect network or channel conditions.

SUMMARY OF THE INVENTION

In accordance with the invention, multi-rate coding is implemented to generate multiple subrate representations of a signal containing information, e.g., audio information. These representations are different from one another and may be delivered at rates lower than or equal to the required delivery rates of the information.

For example, in providing the music-on-demand service described above, at least one of the subrate representations, referred to as a "C-representation," may contain core information delivered at a subrate of 28.8 kb/sec. The other subrate representations, referred to as a "$E_1$-representation" and "$E_2$-representation, each may contain enhancement information delivered at a subrate of 36 kb/sec. Because of the design of the multi-rate coding in accordance with the invention, in this instance recovery of the signal based on the C-representation alone affords the minimum acceptable 28.8 kb/sec signal quality; recovery of the signal based on the C-representation in combination with either $E_1$-representation or $E_2$-representation affords a higher 64 kb/sec signal quality; and recovery of the signal based on the C-representation in combination with both $E_1$-representation and $E_2$-representation affords the highest 100 kb/sec signal quality. Advantageously, the server of the aforementioned music-on-demand service needs to store in its memory the subrate representations, i.e., 28.8 kb/sec C-representation, 36 kb/sec $E_1$-representation and 36 kb/sec $E_2$-representation, of each musical piece, in lieu of the 28.8 kb/sec, 64 kb/sec and 100 kb/sec versions thereof as in prior art, to accommodate the different connection speeds and quality requirements, thereby effectively saving the memory space.

In accordance with an aspect of the invention, when the subrate representations are communicated to a client terminal in the form of packets, each packet includes at least an information content derived from one of the representations, and an indicator identifying the representation from which the information content is derived. Despite losses of some packets in transit because of imperfect channel or network conditions, the signal is recovered based on at least the received packets indicated to contain C-representation information to maintain the minimum acceptable signal quality.

DETAILED DESCRIPTION

Figure 1:
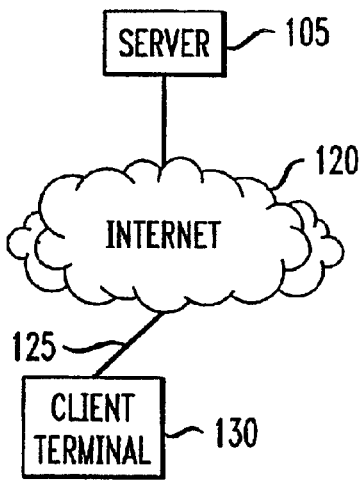
FIG. 1 illustrates an arrangement embodying the principles of the invention for communicating audio information through a communication network.

FIG. 1 illustrates arrangement 100 embodying the principles of the invention for communicating information, e.g., audio information. In this illustrative embodiment, server 105 in arrangement 100 provides a music-on-demand service to client terminals through Internet 120. One such client terminal is numerically denoted 130 which may be a personal computer (PC). As is well known, Internet 120 is a packet switched network for transporting information in packets in accordance with the standard transmission control protocol/Internet protocol (TCP/IP).

Conventional software including browser software, e.g., the NETSCAPE NAVIGATOR or MICROSOFT EXPLORER browser is installed in client terminal 130 for communicating information with server 105, which is identified by a predetermined uniform resource locator (URL) on Internet 120. For example, to request the music-on-demand service provided by server 105, a modem (not shown) in client terminal 130 is used to first establish communication connection 125 with Internet 120. Depending on the telecommunication facility subscribed by the user of client terminal 130, communication connection 125 may be limited by different connection speeds. For instance, a plain old telephone service (POTS) connection typically affords a connection speed of about 28.8 kb/sec; an integrated services digital network (ISDN) connection typically affords a connection speed of about 64 kb/sec; and a dual ISDN connection typically affords a connection speed on the order of 100 kb/sec.

After the establishment of communication connection 125, in a conventional manner, client terminal 130 is assigned an IP address for its identification. The user at client 130 may then access the music-on-demand service at the predetermined URL identifying server 105, and request a selected musical piece from the service. Such a request includes the IP address identifying client terminal 130, and its connection speed.

In prior art, in providing the music-on-demand service, a server needs to store versions of each musical piece corresponding to different connection speeds supported by the server. The audio quality (distortion) of a version of the musical piece increases (decreases) with the corresponding connection speed. Thus, if a prior art server supports three connection speeds, e.g., 28.8 kb/sec, 64 kb/sec and 100 kb/sec, the server needs to store three different versions of each musical piece available having the respective qualities. However, the storage of musical pieces in this manner is undesirably inefficient and occupies much memory space especially when a large number of musical pieces need to be made available. In addition, in delivering the service to a client terminal, the server typically sends the audio information in the form of packets through the Internet. However, in the event that some of the packets are lost in transit because of imperfect network or channel conditions, which is likely, the quality of the received audio information would be significantly degraded.

In accordance with the invention, multi-rate audio coding is implemented in server 105 to generate subrate representations of each musical piece to save memory space. Different combinations of the subrate representations of a musical piece correspond to different connection speeds, and audio qualities of the musical piece. In general, the more subrate representations are communicated to a client terminal, the higher the audio quality of the musical piece recovered at the terminal and, of course, the higher the connection speed required of the terminal. For example, in this illustrative embodiment, three subrate representations are used in server 105 to serve each musical piece in accordance with the invention. One of the subrate representations represents core audio information contained in the musical piece, and is referred to as a "C-representation." The other two subrate representations represent first and second enhancement audio information contained in the musical piece, and are referred to as "$E_1$-representation" and "$E_2$-representation," respectively. Because of the design of the multi-rate coding in accordance with the invention, the audio signals recovered based on the C-representation alone, although viable, afford the minimum acceptable quality version of a musical piece; the audio signals recovered based on the C-representation in combination with either $E_1$-representation or $E_2$-representation afford a relatively high quality version of the musical piece; the audio signals recovered based on the C-representation in combination with both $E_1$-representation and $E_2$-representation afford the highest quality version of the musical piece. However, any audio signals recovered based only on the $E_1$-representation and/or $E_2$-representations are not viable.

An embedded audio coder in accordance with the invention is used in server 105 to generate the C-representation requiring a bit rate of, say, 28.8 kb/sec for communication thereof; the $E_1$-representation requiring a bit rate of, say, 36 kb/sec; and the $E_2$-representation requiring a bit rate of, say, 36 kb/sec as well. These bit rates are selected such that if all of the representations are used, the quality of the recovered musical piece version is close to that of a 100 kb/sec version generated by a conventional non-embbeded audio coder. Similarly, the quality of the recovered musical piece version based on a combination of the C-representation with the $E_1$-representation or $E_2$-representation is close to that of a 64 kb/sec version generated by the conventional non-embedded audio coder. Apparently, the quality of the recovered musical piece version based on the C-representation alone is the same as that of a 28.8 kb/sec version generated by the conventional non-embedded audio coder. Advantageously, server 105 only needs to store in its memory the 28.8 kb/sec C-representation, 36 kb/sec $E_1$-representation and 36 kb/sec $E_2$-representation of each musical piece, in lieu of the 28.8 kb/sec, 64 kb/sec and 100 kb/sec versions thereof as in prior art, to accommodate different connection speeds (e.g., 28.8 kb/sec, 64 kb/sec and 100 kb/sec), thereby saving the memory space.

Figure 2:
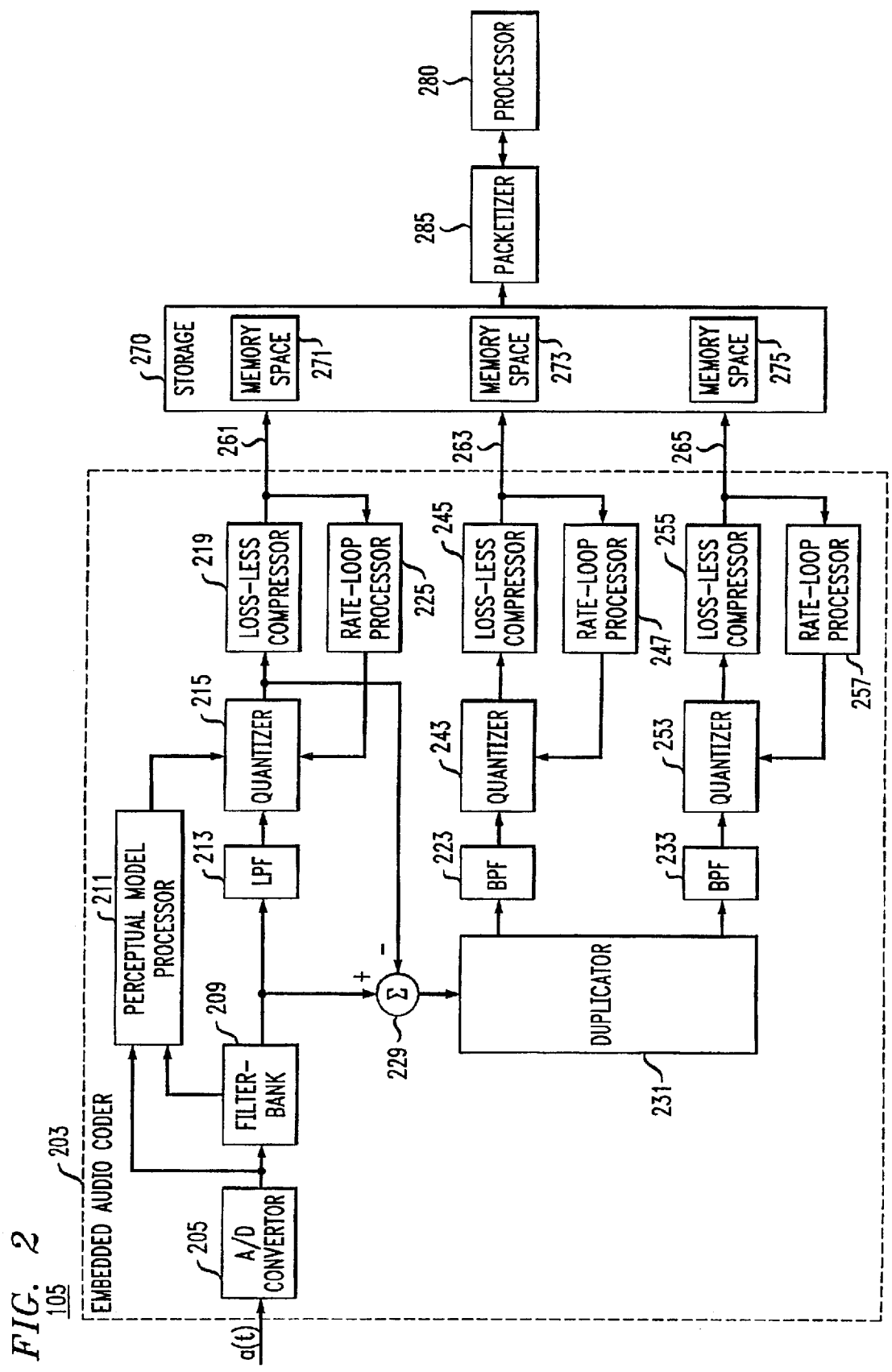
FIG. 2 is a block diagram of a server in the arrangement of FIG. 1.

The aforementioned embbeded audio coder implementing multi-rate coding in accordance with the invention will now be described. FIG. 2 illustrates one such embbeded audio coder, denoted 203, in server 105. An analog signal a(t) representing a musical piece is fed to embedded audio coder 203 in providing the music-on-demand service. In response to such an analog signal, analog-to-digital (A/D) convertor 205 in coder 203 digitizes a(t) in a conventional manner, providing PCM samples of a(t). These PCM samples are fed to both filterbank 209 and perceptual model processor 211. Filterbank 209 divides the samples into time domain blocks, and performs a modified discrete cosine transform (MDCT) on each block to provide a frequency domain representation therefor. Such a frequency domain representation is band-limited by low-pass filter (LPF) 213 to the 0 to 10 kHz frequency range in this instance. The resulting MDCT coefficients are grouped by quantizer 215 according to coder bands for quantization. These coder bands approximate the well known critical bands of the human auditory system, although limited to the 0 to 10 kHz frequency range in this instance. Quantizer 215 quantizes the MDCT coefficients corresponding to a given coder band with the same quantizer stepsize.

Perceptual model processor 211 analyzes the audio signal samples and determines the appropriate level of quantization (i.e., stepsize) for each coder band. This level of quantization is determined based on an assessment of how well the audio signal in a given coder band masks noise. Quantizer 215 generates quantized MDCT coefficients for application to loss-less compressor 219, which in this instance performs a conventional Huffman compression process on the quantized coefficients, resulting in the aforementioned C-representation on lead 261. The output of compressor 219 is fed back to quantizer 215 through rate-loop processor 225. In a conventional manner, the latter adjusts the output of quantizer 215 to ensure that the bit rate of the C-representation is maintained at its target rate, which in this instance is 28.8 kb/sec.

In this illustrative embodiment, the $E_1$-representation and $E_2$-representation are generated by coder 203 for enhancing the quality of the musical piece which contain spectral information concerning relatively high frequency components of the audio signal, e.g., in the 7 to 20 kHz range. To that end, the quantized MDCT coefficients from quantizer 215 are subtracted by subtracter 229 from the MDCT output of filterbank 209. The resulting difference signals are duplicated by duplicator 231, and then bandlimited respectively by band-pass filters (BPFs) 223 and 233 to the 7 to 20 kHz range. Each of quantizers 243 and 253 receives a copy of the filtered difference signals and quantizes the received signals according to predetermined stepsizes.

Quantizers 243 and 253 may be scalar quantizers or multidimensional quantizers, and may comprise a complementary quantizer pair. Complementary scalar quantizers are well known in the art, and described, e.g., in V. Vaishampayan, "Design of Multiple Description of Scalar Quantizers," *IEEE Transactions on Information Theory*, Vol. 39, No. 3, May 1993, pp. 821–834. In general, a pair of complementary scalar quantizers may be defined by the following encoding functions $f_1$ and $f_2$, respectively:

$$f_1(x): \mathfrak{R} \to \{x_i\}_{i=1}^{m1}, \text{ and}$$

$$f_2(y): \mathfrak{R} \to \{y_j\}_{j=1}^{m2},$$

where $\mathfrak{R}$ represents the real axis, $m1=2^{S1}$ and $m2=2^{S2}$, where S1 and S2 represent the bit rates for quantizers 243 and 253, respectively. As is well known, associated with each of the quantized values $x_i$ and $y_j$ for $f_1$ and $f_2$, respectively, is a range or partition [x, y) on the real axis such that all the values in this range are quantized to $x_i$ or $y_j$.

In prior art, to take advantage of the correlation between $x_i$ and $y_j$ from $f_1$ and $f_2$ having a complementary relationship, joint decoding, also known as "center decoding," on $(x_i, y_j)$ is performed in a de-quantizer to realize the optimum decoded value $z_k$ such that the resulting distortion or quantization error is minimized. The center decoding function, $\bar{d}$, performed in the de-quantizer may be expressed as follows:

$$\bar{d}(x, y): \{(x_i, y_j)\}_{i=1, j=1}^{i=m1, j=m2} \to \{z_k\}_{k=1}^m.$$

It should be noted that not all $(x_i, y_j)$ are valid decodable combinations depending upon the overlap between their associated partitions. Let $Q_1$, $Q_2$ and $\overline{Q}$ be the average distortions associated with $f_1$, $f_2$ and center decoding function $\bar{d}$, respectively, and let's assume that $f_1$ and $f_2$ are equivalent, i.e., S1=S2=S. If $Q_1 < 2^{-2S}$ and $Q_2 < 2^{-2S}$, by minimizing $\overline{Q}$ subject to the condition $Q_1$ and $Q_2 \leq Q$, where Q is a predetermined distortion value, it can be shown that the value of $\overline{Q}$ is always greater than the following limit:

$$\overline{Q} > \frac{1}{2} 2^{-2S}.$$

That is, use of the complementary scalar quantizers affords at most a 3 dB gain, compared with the case where only an individual scalar quantizer is used.

However, it has been recognized that the average distortion $\overline{Q}$ associated with center decoding can be improved if the complementary quantizers used are multidimensional, rather than scalar as in prior art. In this illustrative embodiment, quantizers 243 and 253 are complementary multidimensional quantizers in accordance with the invention. Preferably, they are non-homogeneous multidimensional lattice quantizers.

Figure 3A:
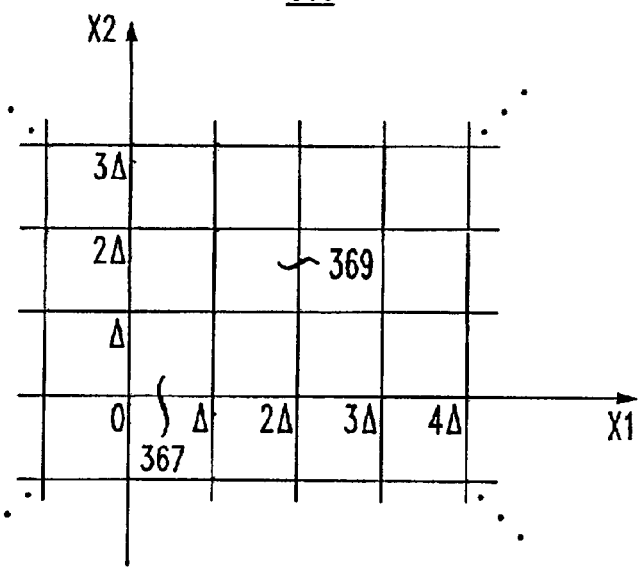
FIG. 3A illustrates a homogeneous multidimensional lattice based on which a prior art quantizer performs quantization.

In order to more appreciate the advantages of use of complementary non-homogeneous multidimensional lattice quantizers in accordance with the invention, let's first consider a prior art homogeneous 2-dimensional lattice quantizer using a square lattice in a 2-dimensional region for quantization. FIG. 3A illustrates one such 2-dimensional region which is defined by X1 and X2 axes and denoted 360. Region 360 in this instance has a square lattice and contains Voronoi regions or cells, e.g., cells 367 and 369, whose length is denoted Δ, where Δ represents a predetermined value. As shown in FIG. 3A, these cells are homogeneously distributed throughout region 360, and are each identified by a different code. As is well known, in the quantization process, the prior art quantizer assigns to an input sample point (x1, x2) the code identifying the cell in which the sample point falls, where x1∈X1 and x2∈X2. For example, sample points having $0 \leq x1 < \Delta$, and $0 \leq x2 < \Delta$ are each assigned the code identifying cell 367. In addition, sample points having $\Delta \leq x1 < 2\Delta$, and $\Delta \leq x2 < 2\Delta$ are each assigned the code identifying cell 369. In practice, each code assignment is achieved by looking up a codebook.

The above prior art quantizer imposes an average distortion proportional to $\Delta^2$ which in turn is proportional to $2^{-2S}$, where in the multidimensional case here S represents the number of bits/sample/dimension multiplied by the sample rate.

Figure 3B:
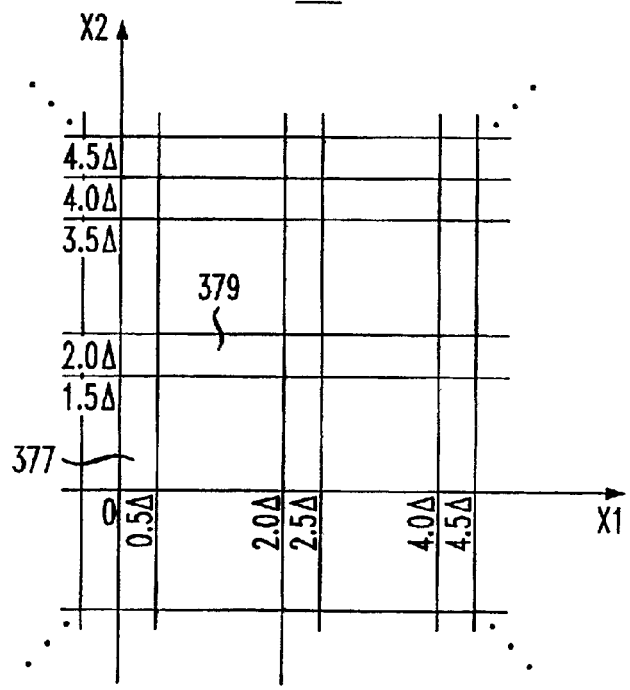
FIG. 3B illustrates a first non-homogeneous multidimensional lattice based on which a first complementary quantizer in the server of FIG. 2 performs quantization.

As mentioned before, in the preferred embodiment, quantizers 243 and 253 are complementary non-homogeneous multidimensional lattice quantizers. For example, in the 2-dimensional case, quantizers 243 and 253 use non-homogeneous rectangular lattices in 2-dimensional regions 370 and 390, respectively. In FIG. 3B, like region 360, region 370 is defined by X1 and X2 axes. However, unlike region 360, region 370 contains Voronoi regions or cells, e.g., cells 367 and 369, which are in different shapes and thus non-homogeneous throughout region 370. By way of example, the vertical boundaries of the rectangular cells in region 370 intersect the X1 axis at x1=0, 0.5Δ, 2.0Δ, 2.5Δ, 4.0Δ . . . , with the separations between successive vertical boundaries alternating between 0.5Δ and 1.5Δ. On the other hand, the horizontal boundaries of the rectangular cells in region 370 intersect the X2 axis at x2=0, 1.5Δ, 2.0Δ, 3.5Δ, 4.0Δ . . . , with the separations between successive horizontal boundaries alternating between 1.5Δ and 0.5Δ. In the quantization process, quantizer 343 assigns to an input sample point (x1, x2) the code identifying the cell in which the sample point falls. For example, sample points having $0 \leq x1 < 0.5\Delta$, and $0 \leq x2 < 1.5\Delta$ are each assigned the code identifying cell 377. In addition, sample points having $0.5\Delta \leq x1 < 2.0\Delta$, and $1.5\Delta \leq x2 < 2.0\Delta$ are each assigned the code identifying cell 379.

Figure 3C:
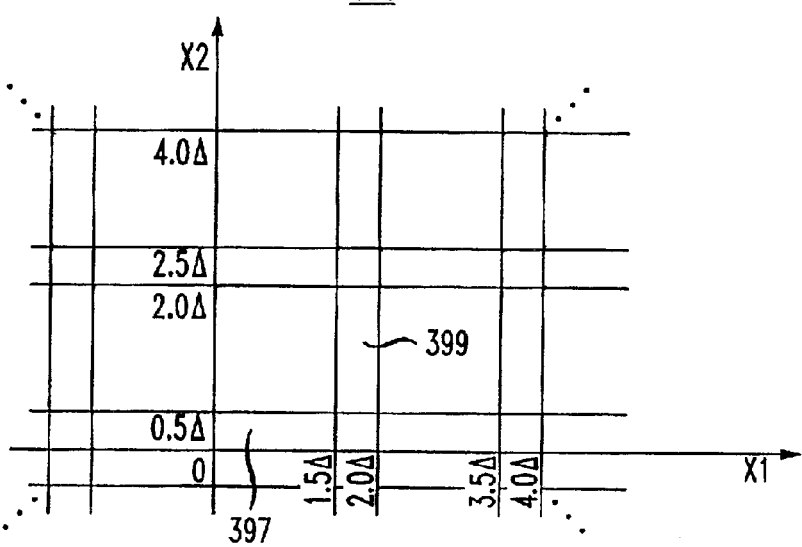
FIG. 3C illustrates a second non-homogeneous multidimensional lattice based on which a second complementary quantizer in the server of FIG. 2 performs quantization.

A simple way of designing the rectangular lattice in region 390 of quantizer 253, which is complementary to quantizer 243, is to adopt the vertical and horizontal boundaries in region 370 as the horizontal and vertical boundaries in region 390, respectively. FIG. 3C illustrates the resulting region 390 containing cells, e.g., cells 391 and 399, which are in different shapes, and thus non-homogeneous throughout region 390. In the quantization process, quantizer 253 assigns to an input sample point (x1, x2) the code identifying the cell in which the sample point falls. For example, sample points having $0 \leq x1 < 1.5\Delta$, and $0 \leq x2 < 0.5\Delta$ are each assigned the code identifying cell 397. In addition, sample points having $1.5\Delta \leq x1 < 2.0\Delta$, and $0.5\Delta \leq x2 < 2.0\Delta$ are each assigned the code identifying cell 399.

It can be shown that the average distortion for an individual one of quantizers 243 and 253 equals $1.25\epsilon 2^{-2S}$, where $\epsilon$ represents a constant which depends on the probability density function of the input signal to the quantizer, and S in this instance equals 36 kb/s. However, stemming from the fact that quantizers 243 and 253 are complementary quantizers, center decoding on the quantized values from quantizers 243 and 253 respectively can be performed in a de-quantizer. It can be shown that the resulting average distortion $\overline{Q}$ associated with 2-dimensional center decoding is no more than $0.25\epsilon 2^{-2S}$. That is, complementary quantizers 243 and 253 when implemented with the 2-dimensional center decoding command a 6 dB improvement in terms of distortion over their scalar counterparts.

The equivalent lattices of three and higher dimensions of complementary quantizers may be obtained similarly to those of two dimensions described above. However, in three or higher dimensions, it is more advantageous to use a non-homogeneous, non-rectangular (or non-hypercube) lattice in each complementary quantizer.

Referring back to FIG. 2, the quantized signals from quantizer 243 are fed to loss-less compressor 245 which, like compressor 219, achieves bit compression on the quantized signals, resulting in the $E_1$-representation on lead 263. The $E_1$-representation is fed back to quantizer 243 through rate-loop processor 247 to ensure that the bit rate of the $E_1$-representation is maintained at its target rate, which in this instance is S1=36 kb/sec.

Similarly, the quantized signals from quantizer 253 are fed to loss-less compressor 255 which achieves bit compression on the quantized signals, resulting in the $E_2$-representation on lead 265. The $E_2$-representation is fed back to quantizer 253 through rate-loop processor 257 to ensure that the bit rate of $E_2$-representation is maintained at its target rate, which in this instance is S2=36 kb/sec.

Leads 261, 263 and 265 extend to storage 270 where the C-representation on lead 261 is stored in memory space 271, the $E_2$-representation on lead 263 is stored in memory space 273, and the $E_2$-representation on lead 265 is stored in memory space 275.

In response to the aforementioned request from client terminal 130 for transmission of the selected musical piece thereto, processor 280 causes packetizer 285 to generate a stream of packets including one or more of the stored representations of the selected musical piece, depending on the given connection speed. Each packet in the stream is destined for client terminal 130 as it contains in its header, as a destination address, the IP address of terminal 130 requesting the music-on-demand service.

Specifically, if the given connection speed is 100 kb/sec, packetizer 285 retrieves from memory spaces 271, 273 and 275 the C-representation, $E_1$-representation and $E_2$-representation of the selected musical piece, and packetizes the retrieved representations in accordance with the TCP/IP format. The resulting packet stream is forwarded by processor 280 to Internet 120.

Figure 4:
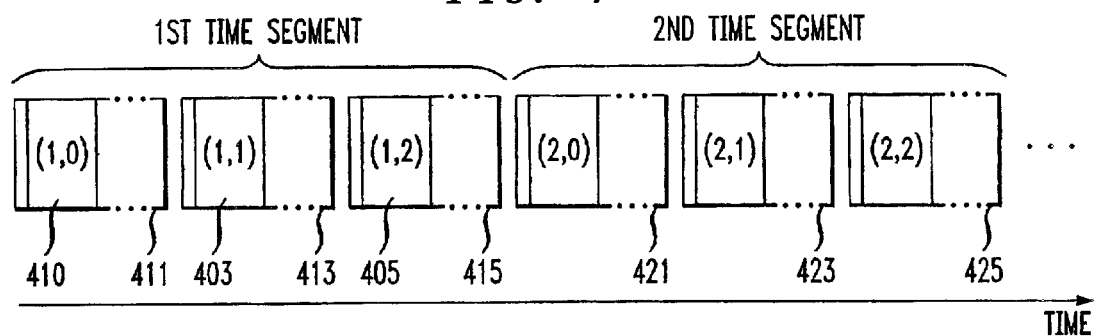
FIG. 4 illustrates a stream of packets generated by the server of FIG. 2.

FIG. 4 illustrates such a packet stream, wherein packets 411, 413 and 415 generated by packetizer 285 respectively contain C-representation, $E_1$-representation and $E_2$-representation information corresponding to a first time segment of the musical piece; packets 421, 423 and 425 respectively contain C-representation, $E_1$-representation and $E_2$-representation information corresponding to a second time segment of the musical piece; and so on so forth. To facilitate the assembly of the packets by client terminal 130 when it receives them, the header of each packet contains synchronization information. In particular, the synchronization information in each packet includes a pair of indexes where a sequence index indicating the time segment to which the packet corresponds, followed by a representation index indicating one of the representations with which the packet is associated. For example, field 401 in the header of packet 411 contains the index pair (1, 0), with the sequence index "1" indicating that the packet corresponds to the first time segment, and the representation index "0" indicating that the packet is associated with the C-representation. Similarly, field 403 in the header of packet 413 contains the index pair (1, 1), with the sequence index "1" indicating that the packet corresponds to the first time segment, and the representation index "1" indicating that the packet is associated with the $E_1$-representation. Field 405 in the header of packet 415 contains the index pair (1, 2), with the sequence index "1" indicating that the packet corresponds to the first time segment, and the representation index "2" indicating that the packet is associated with the $E_2$-representation.

Similarly, the sequence index in each of packets 421, 423 and 425 has a value "2" indicating that the packet corresponds to the second time segment. In addition, the representation indexes of packets 421, 423 and 425 have values "0," "1," and "2", respectively, indicating their respective associations with the C-representation, $E_1$-representation and $E_2$-representation.

Figure 5:
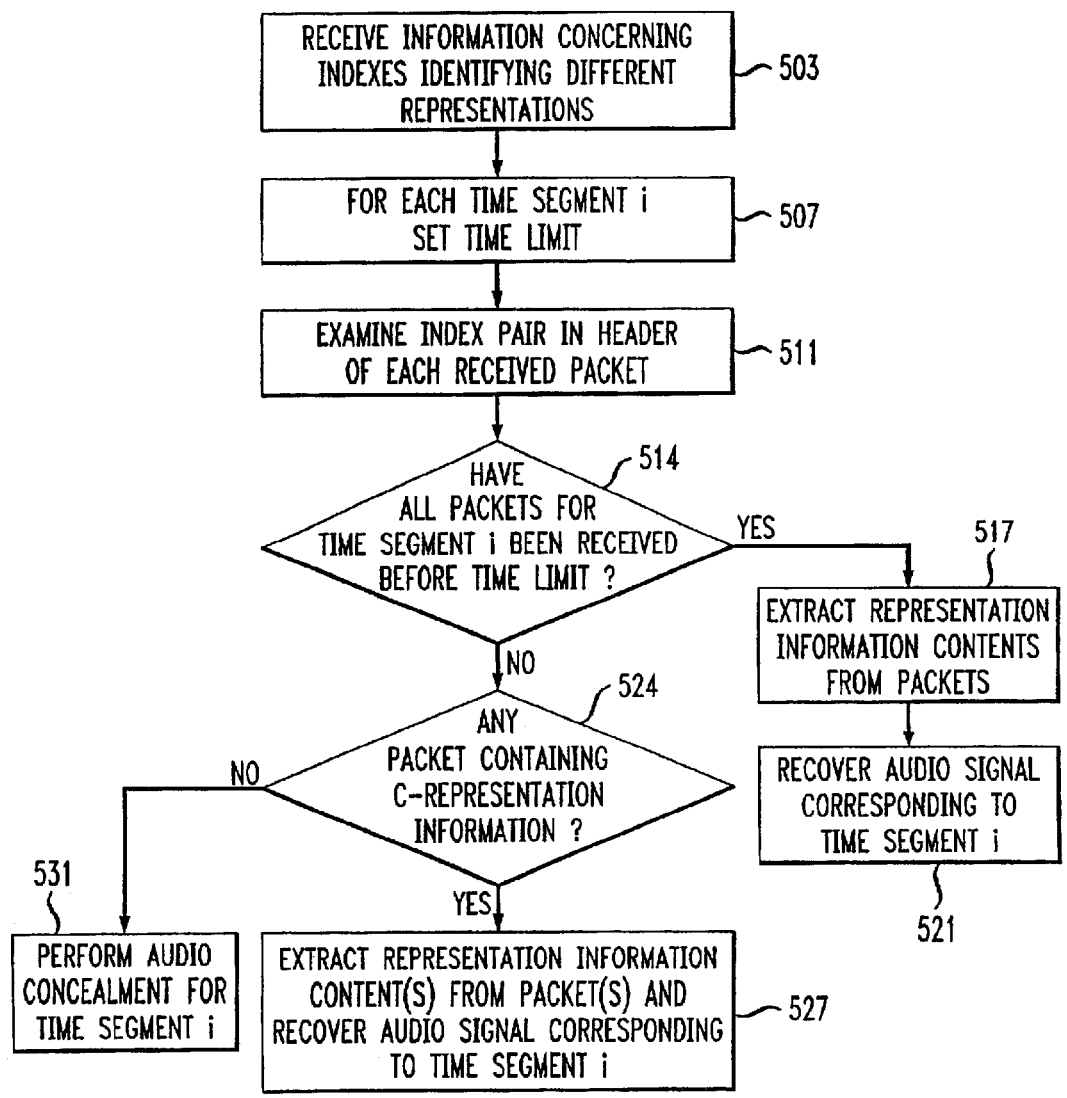
FIG. 5 is a flow chart depicting the steps whereby a client terminal in the arrangement of FIG. 1 processes the packets from the server.

Client terminal 130 processes the packet stream from server 105 in accordance with a routine which may be realized using software and/or hardware installed in terminal 130. FIG. 5 illustrates such a routine, denoted 500, where at step 503 terminal 130 receives from server 105 information concerning the indexes identifying the different representations provided thereby to terminal 130. In this example where the connection speed is 100 kb/sec, as mentioned before terminal 130 is provided with the C-representation, $E_1$-representation and $E_2$-representation of the musical piece which are identified by representation indexes "0," "1," and "2," respectively. Accordingly, upon receipt of the packet stream of FIG. 4, terminal 131 processes the packets on a time segment by time segment basis, and expects to receive three packets associated with the respective representations for each time segment i, $1 \leq i \leq N$, where N is the total number of time segments which the musical piece comprises. In this illustrative embodiment, each time segment has the same predetermined length.

Specifically, at step 507, for each time segment i, terminal 130 sets a predetermined time limit within which any packets associated with the time segment are received for processing. Terminal 130 at step 511 examines the aforementioned index pair in the header of each received packet. Based on the sequence index value and the representation index value of the received packets, terminal 130 at step 514 determines whether all of the expected packets for time segment i have been received before the time limit expires. If all of the expected packets have been received, routine 500 proceeds to step 517 where terminal 130 extracts the representation information contents from the respective packets. At step 521, terminal 130 performs on the extracted information the inverse function to embedded audio coder 203 described above to recover a(t) corresponding to time segment i. In particular, in this example where the extracted information includes C-representation information, $E_1$-representation information and $E_2$-representation information, respectively, the aforementioned center decoding is performed on the $E_1$-representation information and $E_2$-representation information based on their correlation to minimize the average distortion in the recovered a(t).

Otherwise, if the aforementioned time limit expires before all of the expected packets are received for time segment i, terminal 130 at step 524 determines whether any received packets for the time segment includes the packet containing C-representation information. If it is determined that at least the packet containing C-representation information has been received, terminal 130 extracts representation information content(s) from the received packet(s) for time segment i, and based on the extracted information recovers a(t) corresponding to time segment i, as indicated at step 527. In that case, the audio recovery may be based on only C-representation information corresponding to 28.8 kb/s quality, or on C-representation information in combination with either $E_1$-representation information or $E_2$-representation information corresponding to 64 kb/s quality. Otherwise, if no packet containing C-representation information has been received, terminal 130 does not perform any recovery using the received packets for time segment i as any such recovery results in a non-viable a(t). Rather, terminal 130 performs well known audio concealment for time segment i, e.g., interpolation based on the results of audio recovery in neighboring time segments, as indicated at step 531.

If the given connection speed is 64 kb/sec or 28.8 kb/sec instead of 100 kb/sec in the above example, the above-described process similarly follows, although in the 64 kb/sec connection speed case only C-representation information and $E_1$-representation information or $E_2$-representation information are communicated by server 105 to client terminal 130, and in the 28.8 kb/sec connection speed case only C-representation information is communicated.

The foregoing merely illustrates the principles of the invention. It will thus be appreciated that those skilled in the art will be able to devise numerous other arrangements which embody the principles of the invention and are thus within its spirit and scope.

For example, in anticipation of packet losses because of imperfect network conditions, server 105 in the illustrative embodiment may implement path diversity by routing streams of packets containing equivalent amounts of audio information through different paths to the same client terminal. Each packet in each stream corresponds to a different time segment of the audio signal to be recovered. For each time segment, the client terminal may use a packet from any one of the streams corresponding to the time segment to recover the audio signal. Thus, despite packet losses, the quality of the recovered signal is maintained as long as the terminal receives one such packet for each time segment. For instance, to deliver an audio signal at 64 kb/sec, server 105 may transmit to the client terminal a first stream of packets containing C-representation information, a second stream of packets containing $E_1$-representation information, and a third stream of packets containing $E_2$-representation information which is equivalent to $E_1$-representation because of use of complementary quantizers 243 and 253, where the second stream and third stream may be routed through different networks to achieve path diversity.

Similarly, server 105 may implement time diversity by transmitting the streams of packets containing equivalent amounts of audio information one-after another through the same network with a predetermined delay.

In addition, based on the disclosure heretofore, it is apparent that a person skilled in the art may generate equivalent C-representations, e.g., $C_1$-representation and $C_2$-representation, using complementary quantizers to achieve path and/or time diversity of such C-representations.

Further, the multi-rate coding technique described above is applicable to communications of not only audio information, but also information concerning text, graphics, video, etc.

Still further, in the disclosed embodiment, the inventive multi-rate coding technique is illustratively applied to a packet switched communications system. However, the inventive technique equally applies to broadcasting systems including hybrid in-band on channel (IBOC) AM systems, hybrid IBOC FM systems, satellite broadcasting systems, Internet radio systems, TV broadcasting systems, etc.

Finally, server 105 is disclosed herein in a form in which various server functions are performed by discrete functional blocks. However, any one or more of these functions could equally well be embodied in an arrangement in which the functions of any one or more of those blocks or indeed, all of the functions thereof, are realized, for example, by one or more appropriately programmed processors.

We claim:

1. Apparatus for providing at least first and second representations of a signal, the first representation being different from the second representation, the apparatus comprising:
    a first quantizer for quantizing at least a portion of the signal in accordance with a first multidimensional lattice to generate the first representation; and
    a second quantizer for quantizing at least the portion of the signal in accordance with a second, different multidimensional lattice to generate the second representation, the first quantizer and the second quantizer being complementary to each other.

2. The apparatus of claim 1 wherein at least one of the first and second multidimensional lattices include a plurality of cells, at least two of the cells being different from each other.

3. The apparatus of claim 1 wherein the signal includes a plurality of frequency components and the portion of the signal includes a subset of the plurality of frequency components.

4. The apparatus of claim 1 wherein the signal contains audio information.

5. The apparatus of claim 4 wherein the signal is encoded in accordance with a perceptual audio coding technique.

6. A method for use in an apparatus for providing at least first and second representations of a signal, the first representation being different from the second representation, the apparatus including a first quantizer and a second quantizer, the first quantizer and the second quantizer being complementary to each other, the method comprising:
    quantizing at least a portion of the signal using the first quantizer in accordance with a first multidimensional lattice to generate the first representation; and
    quantizing at least the portion of the signal using the second quantizer in accordance with a second, different multidimensional lattice to generate the second representation.

7. The method of claim 6 wherein at least one of the first and second multidimensional lattices include a plurality of cells, at least two of the cells being different from each other.

8. The method of claim 6 wherein the signal includes a plurality of frequency components and the portion of the signal includes a subset of the plurality of frequency components.

9. The method of claim 6 wherein the signal contains audio information.

10. The method of claim 9 wherein the signal is encoded in accordance with a perceptual audio coding technique.

* * * * *